(12) United States Patent
Hong et al.

(10) Patent No.: US 8,112,689 B2
(45) Date of Patent: Feb. 7, 2012

(54) ECC CONTROLLER FOR USE IN FLASH MEMORY DEVICE AND MEMORY SYSTEM INCLUDING THE SAME

(75) Inventors: Si-Hoon Hong, Seongnam-si (KR); Yun-Tae Lee, Gangnam-gu (KR); Jun-Jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1326 days.

(21) Appl. No.: 11/785,719

(22) Filed: Apr. 19, 2007

(65) Prior Publication Data

US 2008/0163023 A1 Jul. 3, 2008

(30) Foreign Application Priority Data

Jan. 3, 2007 (KR) .................................. 2007-00732

(51) Int. Cl.
*H03M 13/00* (2006.01)
(52) U.S. Cl. ........................................ 714/755; 714/794
(58) Field of Classification Search .................... 714/52, 714/757, 763, 756, 718, 758, 755, 794
See application file for complete search history.

(56) References Cited

U.S. PATENT DOCUMENTS

| | | | | |
|---|---|---|---|---|
| 6,651,212 | B1* | 11/2003 | Katayama et al. | 714/763 |
| 7,299,399 | B2* | 11/2007 | Huang | 714/757 |
| 7,809,994 | B2* | 10/2010 | Gorobets | 714/52 |
| 7,904,790 | B2* | 3/2011 | Lee et al. | 714/763 |
| 2008/0215952 | A1* | 9/2008 | Bae | 714/756 |

FOREIGN PATENT DOCUMENTS

| | | |
|---|---|---|
| KR | 2001-0005558 | 1/2001 |
| KR | 1020010067139 A | 7/2001 |
| WO | WO9810425 | 3/1998 |

* cited by examiner

*Primary Examiner* — David Ton
(74) *Attorney, Agent, or Firm* — Volentine & Whitt, PLLC

(57) ABSTRACT

An ECC (error correction code) controller of a flash memory device which stores an M-bit data (M being a positive integer equal to or greater than 2) comprises a first ECC block which generates a first ECC data from a program data to be stored in the flash memory device according to a first error correcting method and a second ECC block which generates a second ECC data from the first ECC data and the program data output from the first ECC block according to a second error correcting method, the program data, the first ECC data, and the second ECC data being stored in the flash memory device.

30 Claims, 6 Drawing Sheets

ECC CONTROLLER FOR USE IN FLASH MEMORY DEVICE AND MEMORY SYSTEM INCLUDING THE SAME

BACKGROUND OF THE INVENTION

1. Field of the Invention

The present disclosure relates to memory systems, and, more particularly, to systems and methods for detecting and correcting errors in multi-bit data stored in a flash memory device.

A claim of priority under 35 U.S.C. §119 is made to Korean Patent Application No. 2007-732, filed Jan. 3, 2007, the entire contents of which are hereby incorporated by reference.

2. Description of Related Art

Memory devices are generally categorized into volatile memory devices and non-volatile memory devices. There are many differences between volatile and non-volatile memory devices. For example, non-volatile memory devices retain stored data in the event of a power loss to the device. However, volatile memory devices loose the stored data when there is a power loss. Volatile memory devices include memory devices such as, for example, dynamic random access memories (DRAMs). Non-volatile memory devices include, for example, flash memory devices, read only memory (ROM) devices, electrically programmable read only memory devices (EPROM), and electrically erasable programmable read only (EEPROM) memory devices.

A flash memory device has many beneficial features. For example, though not as fast as dynamic random access memories (DRAMs), the flash memory device has a faster reading speed. Furthermore, a flash memory device can withstand a stronger impact on itself than a hard disk. While a flash memory can electrically erase and rewrite data, unlike EEPROMs, the flash memory device can erase and write data in block units. Furthermore, a flash memory device costs less than the EEPROMs. Because of these and other such features, flash memory devices are widely used as large capacity, non-volatile, solid-state storage devices. For example, flash memory devices are commonly used in cellular phones, digital cameras, and digital sound recording apparatuses.

Generally, the flash memory device stores data in an array including floating gate transistors. These floating gate transistors are called cells and store bit data. Initially, a flash memory device could only store 1-bit data in each cell. However, newer flash memory devices, called multi-level cell (MLC) devices, can store 1-bit or more in one cell by controlling an amount of electric charge accumulated on a floating gate of a cell.

In this disclosure, a flash memory device storing a 1-bit data in one memory cell is referred to as a single-level cell (SLC) flash memory device, and a flash memory device storing an M-bit data in one memory cell is referred to as a multi-level cell (MLC) flash memory device (M is a positive integer equal to or greater than 2).

Reference voltages are used to read data stored in a memory cell. In particular, a reference voltage is applied to a control gate of a memory cell and depending on whether current flows through the cell, the data stored in the cell is determined. Furthermore, the threshold voltage distributions for each reference voltage used to read data are different for different levels of data. For example, the threshold voltage distribution to read data '0' is different than that used to read data '1'. Similarly, the threshold voltage distribution to read data '01' is different and the threshold voltage distribution to read data '11' is also different and so on.

The number of reference threshold voltage distributions used to read data from a flash memory device depends on the bits of data that can be stored in the memory device. That is, the number of threshold voltage distributions depends on whether 1-bit data, 2-bit data, 3-bit data, 4-bit data, etc., can be stored in the memory device. As an example, referring to FIG. 1, two threshold voltage distributions will be used for storing 1-bit data in one memory cell. On the other hand, referring to FIGS. 2 through 4, $2^M$ threshold voltage distributions will be used for storing M-bit data in one memory cell. For example, four threshold voltage distributions are used for storing a 2-bit data in one memory cell, eight threshold voltage distributions are used for storing a 3-bit data in one memory cell, and sixteen threshold voltage distributions are used for storing a 4-bit data in one memory cell. Thus, as the number of data bits stored in one memory cell increases, more threshold voltage distributions will be used.

It follows that as the number of threshold voltage distributions increase, the total threshold voltage used to read data from a cell increases. However, as is well known in the art, there is a limitation in raising a threshold voltage of a memory cell. In other words, the threshold voltage for a memory cell should be distributed within a predetermined voltage range. This means that voltage threshold distributions should be distributed within a predetermined voltage range regardless of the number of data bits stored in one memory cell. For this reason, adjacent threshold voltages may overlap each other as illustrated in FIGS. 2 through 4. As adjacent threshold voltage distributions overlap, the read data may include many error bits (e.g., several error bits or tens of error bits.) Such a phenomenon would be more troublesome as the number of data bits stored in one memory cell increase. In addition, adjacent threshold voltage distributions may also overlap due to various other reasons such as, for example, charge loss, an elapse of a time, a temperature increase, coupling generated while adjacent cells are programmed, a reading operation of an adjacent cell, and other cell defects.

SUMMARY OF THE INVENTION

One aspect of the present disclosure includes an ECC (error correction code) controller of a flash memory device which stores an M-bit data (M being a positive integer equal to or greater than 2). The ECC controller comprises a first ECC block which generates a first ECC data from a program data to be stored in the flash memory device according to a first error correcting method and a second ECC block which generates a second ECC data from the first ECC data and the program data output from the first ECC block according to a second error correcting method, the program data, the first ECC data, and the second ECC data being stored in the flash memory device.

Another aspect of the present disclosure includes a memory system. The memory system comprises a flash memory device which stores an M-bit data (M being a positive integer equal to or greater than 2) and a memory controller which controls the flash memory device, wherein the memory controller comprises an ECC controller which encodes data to be stored in the flash memory device using a first error correcting method and a second error correcting method.

Another aspect of the present disclosure includes a memory system. The system comprises a flash memory device which stores an M-bit data (M being a positive integer equal to or greater than 2) and a memory controller which controls the flash memory device, wherein the memory controller comprises a first ECC block which generates a CRC (cyclic redundancy check) value from a program data to be stored in the flash memory device and outputs a first data pattern and a second ECC block which generates a first ECC data from the first data pattern and outputs a second data pattern according to a first error correcting method and a third ECC block which generates a second ECC data from the second data pattern and outputs a third data pattern according to a second error correcting method.

Yet another aspect of the present disclosure includes a method for correcting an error of an M-bit data (M being a positive integer equal to or greater than 2) stored in a flash memory device. The method comprises generating a first ECC data from a program data to be stored in the flash memory device according to a first error correcting method and generating a second ECC data from the first ECC data and the program data output from a first ECC block according to a second error correcting method, the program data, the first ECC data, and the second ECC data being simultaneously stored in the flash memory device.

Another aspect of the present disclosure includes a method for correcting an error of an M-bit data (M being a positive integer equal to or greater than 2) stored in a flash memory device. The method comprises generating a CRC (cyclic redundancy check) value from a program data to be stored in the flash memory device and outputting a first data pattern, generating a first ECC data from the first data pattern and outputting a second data pattern according to a first error correcting method, and generating a second ECC data from the second data pattern and outputting a third data pattern according to a second error correcting method, the third data pattern including the program data, the CRC value, the first ECC data, and the second ECC data being stored in the flash memory device.

BRIEF DESCRIPTION OF THE FIGURES

The accompanying figures are included to provide a further understanding of the present disclosure, and are incorporated in and constitute a part of this specification. The drawings illustrate exemplary embodiments of the present disclosure and, together with the description, serve to explain principles of the present disclosure. In the figures.

DETAILED DESCRIPTION OF PREFERRED EMBODIMENTS

Figure 1:
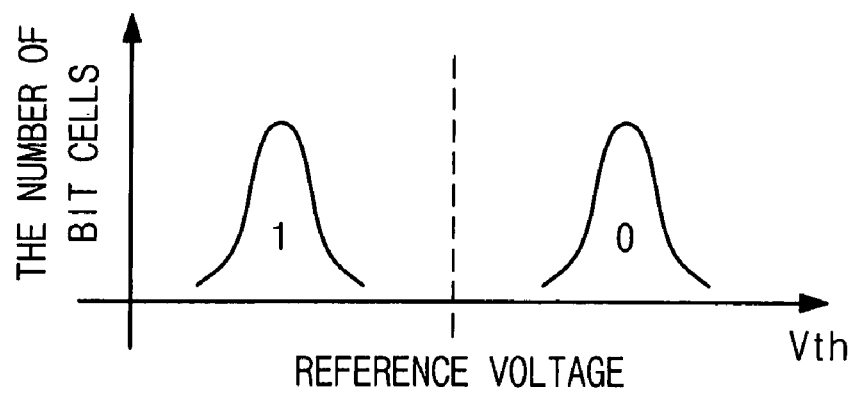
FIG. 1 is a view illustrating threshold voltage distributions of a general flash memory cell storing a 1-bit data.
Figure 2:
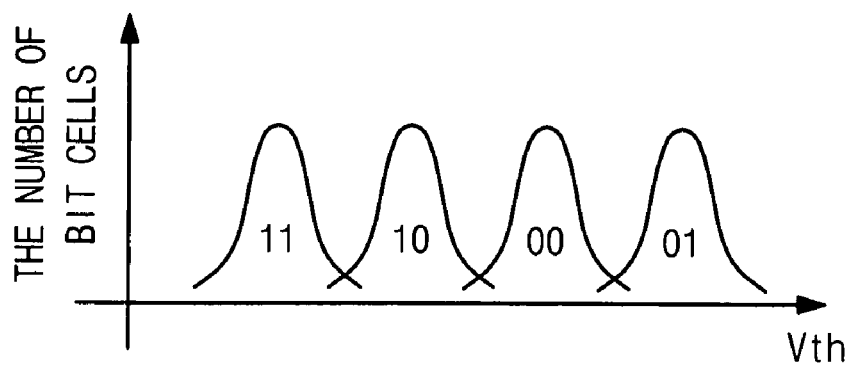
FIG. 2 is a view illustrating threshold voltage distributions of a general flash memory cell storing a 2-bit data.
Figure 3:
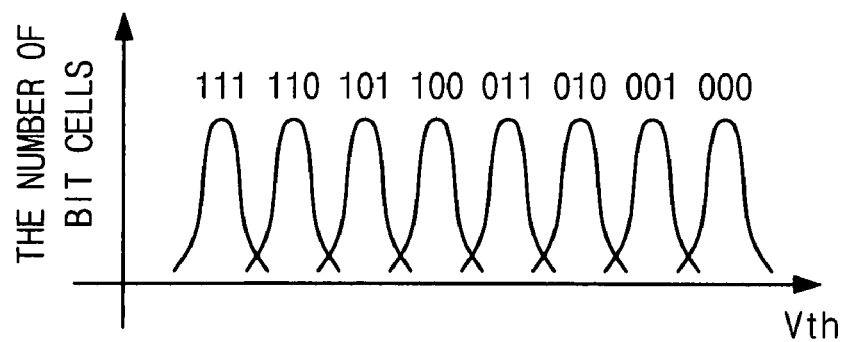
FIG. 3 is a view illustrating threshold voltage distributions of a general flash memory cell storing a 3-bit data.
Figure 4:
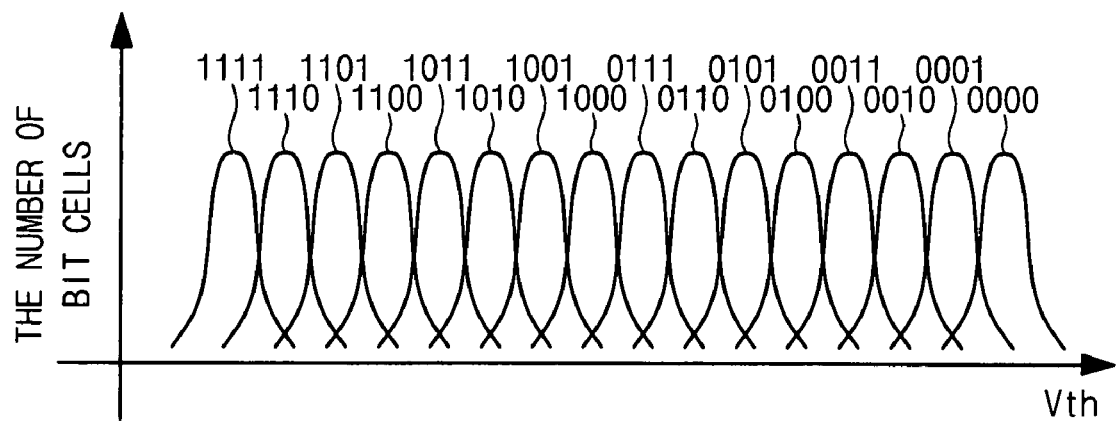
FIG. 4 is a view illustrating threshold voltage distributions of a general flash memory cell storing a 4-bit data.

Exemplary embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout.

In the description, a flash memory device is exemplarily used as a non-volatile memory device to explain characteristics and functions of the present disclosure. A person of ordinary skill in the art would easily understand other advantages and performances from descriptions made herein. The present disclosure may be realized or applied through other embodiments.

Figure 5:
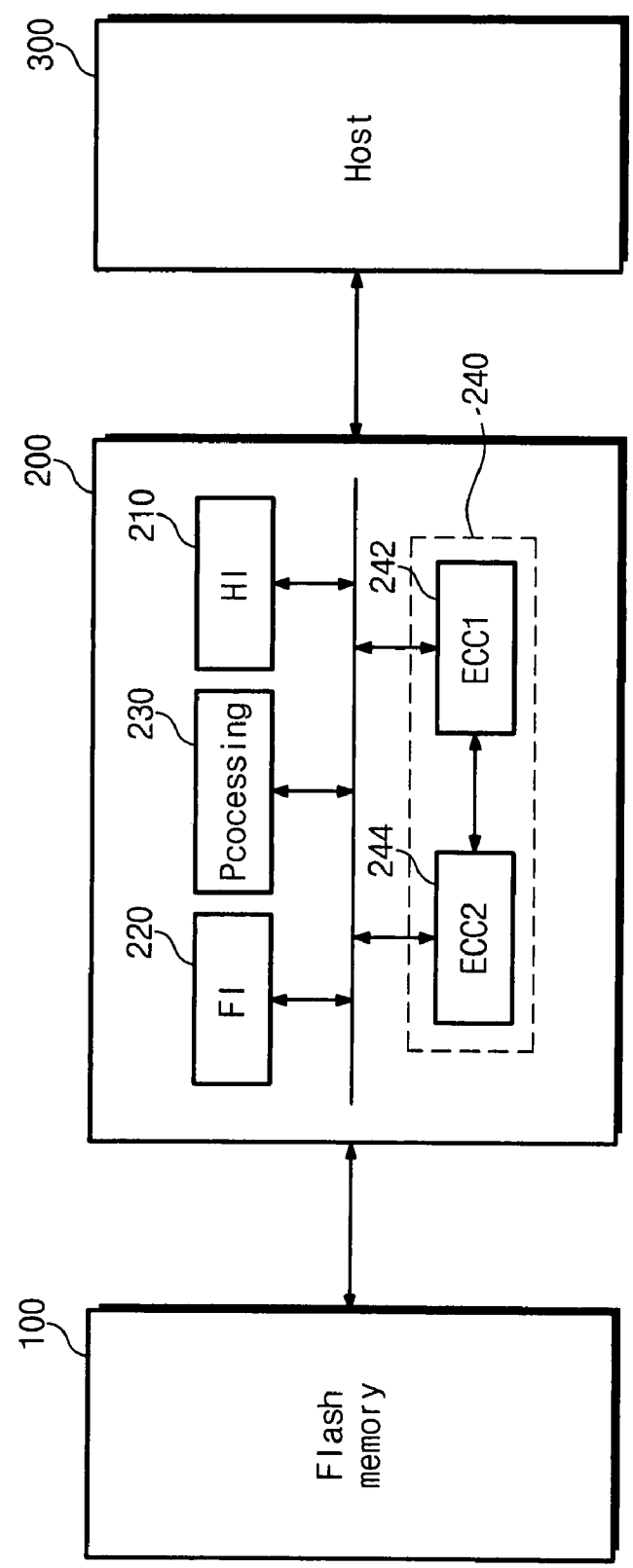
FIG. 5 is a schematic block diagram of a memory system according to an exemplary disclosed embodiment.

FIG. 5 is a schematic block diagram of a memory system according to an exemplary disclosed embodiment. Referring to FIG. 5, the memory system includes a flash memory device 100, and a memory controller 200. The flash memory device 100 operates under control of the memory controller 200 to store an M-bit data per cell. Here, the M-bit data include a 2-bit data, a 3-bit data, and a 4-bit data. According to an exemplary embodiment, the flash memory device 100 may be a NAND flash memory device. However, a person of ordinary skill in the art would understand that the flash memory device 100 is not limited to the NAND flash memory device. For example, the flash memory device 100 may be realized using a non-volatile memory device such as a NOR flash memory device, a PRAM, and MRAM.

The memory controller 200 controls the flash memory device 100 based on a request of a host 300. Furthermore, the memory controller 200 includes a host interface 210, a flash interface 220, a processing unit 230, and an ECC controller 240. The host interface 210 provides an interface with the host 300. The flash interface 220 provides an interface with the flash memory device 100. The processing unit 230 controls operations of the memory controller 200 on the whole. In an exemplary embodiment, the host 300 and the memory controller 200 may communicate via a variety of interfaces such as a NOR interface, a NAND interface, a peripheral component interconnect (PCI), ISO, a universal serial bus (USB), or any other such interface. In addition, the flash memory device 100 and the memory controller 200 may communicate with each other via a well-known NAND/NOR interface. Moreover, in an exemplary disclosed embodiment, the flash memory 100 and the memory controller 200 may constitute a memory card such as a flash memory card and a smart card. Furthermore, the memory controller 200 can be directly installed on a main board of a personal computer (PC). Also, in cases where a flash memory device is used as a buffer memory, the memory controller 200 can be used as a buffer controller of a hard disk drive (HDD).

Still referring to FIG. 5, the ECC controller 240 generates an error control code (ECC) data to be stored in the flash memory device 100. This ECC data may be used for many purposes. For example, the ECC data is used for detecting and/or correcting an error. In particular, the ECC controller 240 detects and corrects errors in data read from the flash memory device 100 by using ECC data. In an exemplary embodiment, the ECC controller 240 uses a two-level error correcting scheme. A first error correcting scheme may be used to generate a linear block code as ECC data from data to be stored in the flash memory device 100. Furthermore, the linear block code may be used to detect and correct error in data read from the flash memory device 100. The first error correcting scheme is referred to as a linear block coding method. However, one skilled in the art will appreciate that other error correcting schemes besides the linear block method may be used without departing from the scope of the disclosure. Furthermore, a second error correcting scheme is used such as, for example, the maximum likelihood (ML) method. The ML method is an encoding and decoding method for reading data with a low-error probability.

In an exemplary embodiment, the ECC controller 240 includes a first ECC block 242. Block 242 performs a linear block coding method. The ECC controller 240 also includes a second ECC block 244 which performs an ML method. In particular, the first ECC block 242 generates a first ECC data from data (referred to as program data) transmitted from the host 300 according to a linear block encoding method. Furthermore, the second ECC block 244 generates a second ECC data from data (i.e., the program data and the first ECC data) output from the first ECC block 242 according to an ML encoding method. The data (the program data, the first ECC data, and the second ECC data) output from the second ECC block 244 are stored in the flash memory device 100 via the flash interface 220.

During a reading operation, the data (including the program data, the first ECC data, and the second ECC data) read from the flash memory device 100 is delivered to the second ECC block 244 via the flash interface 220. The second ECC block 244 detects and/or corrects an error of the data (including the program data, the first ECC data, and the second ECC data) received according to the ML method. The data that is thus corrected by the ML method is then transferred to the first ECC block 242. The first ECC block 242 detects and/or corrects an error of the data (including the program data and the first ECC data) output from the second ECC block 240 according to a linear block decoding method. Data output from the first ECC block 242 is then transferred to the host 300 via the host interface 210.

As described above, the disclosed ECC controller 240 reads data from the flash memory device 100 with a low-error probability according to the ML method, and detects and corrects an error of data read with the low-error probability according to the linear block coding method. This two-level error correcting scheme may cause multi-bit data to be read more accurately.

Figure 6:
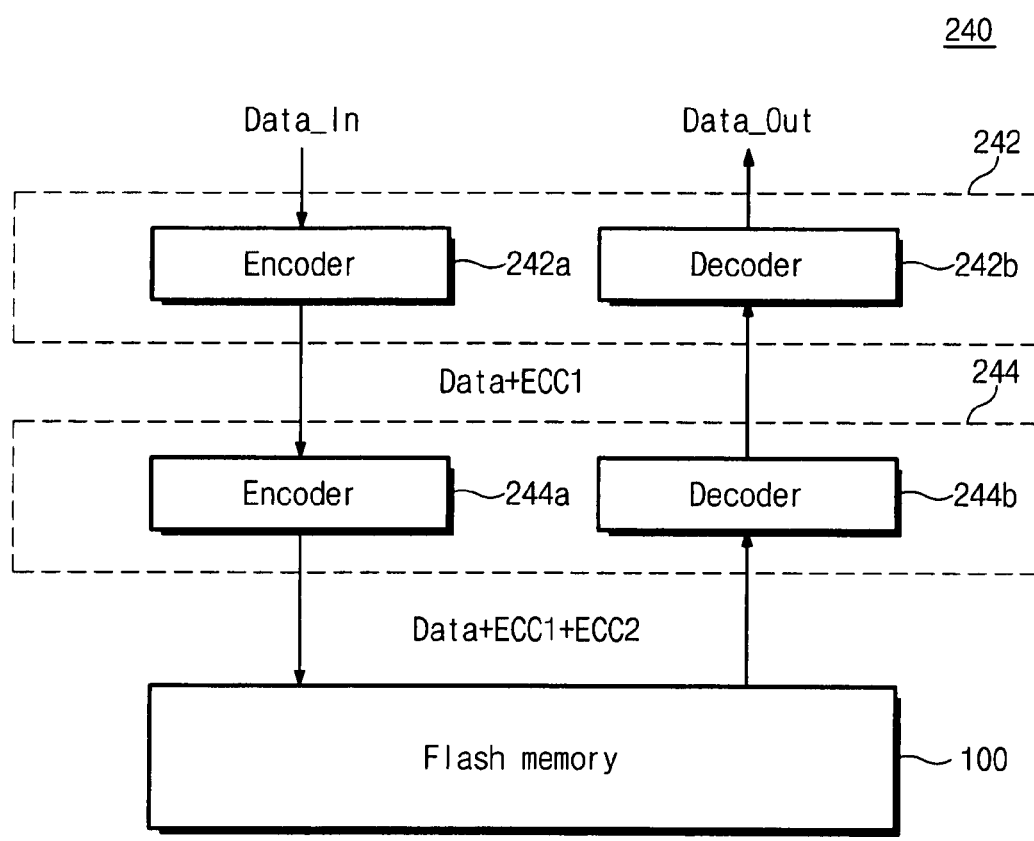
FIG. 6 is a schematic block diagram of the ECC controller illustrated in FIG. 5 according to an exemplary disclosed embodiment.

FIG. 6 is a schematic block diagram of the ECC controller illustrated in FIG. 5 according to an exemplary disclosed embodiment. Referring to FIG. 6, the ECC controller 240 includes the first ECC block 242 and the second ECC block 244. In an exemplary embodiment, the first ECC block 242 operates according to the linear block coding method, and includes a linear block encoder 242a and a linear block decoder 242b. Similarly, the second ECC block 244 operates according to the ML coding method, and includes an ML encoder 244a and an ML decoder 244b.

The linear block encoder 242a of the first ECC block 242 generates a first ECC data from data (referred to as program data) transmitted from the host 300 according to the linear block encoding method. The ML encoder 244a of the second ECC block 244 generates a second ECC data 'ECC' from data (i.e., the program data and the first ECC data or a data pattern) output from the encoder 242a of the first ECC block 242 according to the ML encoding method. Furthermore, the data (the program data, the first ECC data, and the second ECC data) (or the data pattern) output from the ML encoder 244a of the second ECC block 244 is stored in the flash memory device 100 via the flash interface 220. Any method well known in the art may be used to transfer and store the data thus encoded into the flash memory device.

In a reading operation, the data (including the program data, the first ECC data, and the second ECC data) read from the flash memory device 100 is delivered to the ML decoder 244b of the second ECC block 240 via the flash interface 220.

The ML decoder 244b of the second ECC block 240 detects and corrects an error of the data (including the program data, the first ECC data, and the second ECC data) received according to the ML method. In particular, the ML decoder 244b detects data of a low-error probability. That is, data having low-error probability is obtained by the ML decoder 244b. An error of the data obtained in this manner may be corrected partially by the ML decoder 244b. Also, the data obtained in this manner may be output without error correction because the data output from the flash memory 100 has low-error probability to begin with. The linear block decoder 242b of the first ECC block 242 detects and corrects an error of the data (including the program data and the first ECC data) output from the ML decoder 244b of the second ECC block 240 according to a linear block decoding method. The data output from the linear block decoder 242b of the first ECC block 242 is transferred to the host 300 via the host interface 210.

Figure 7:
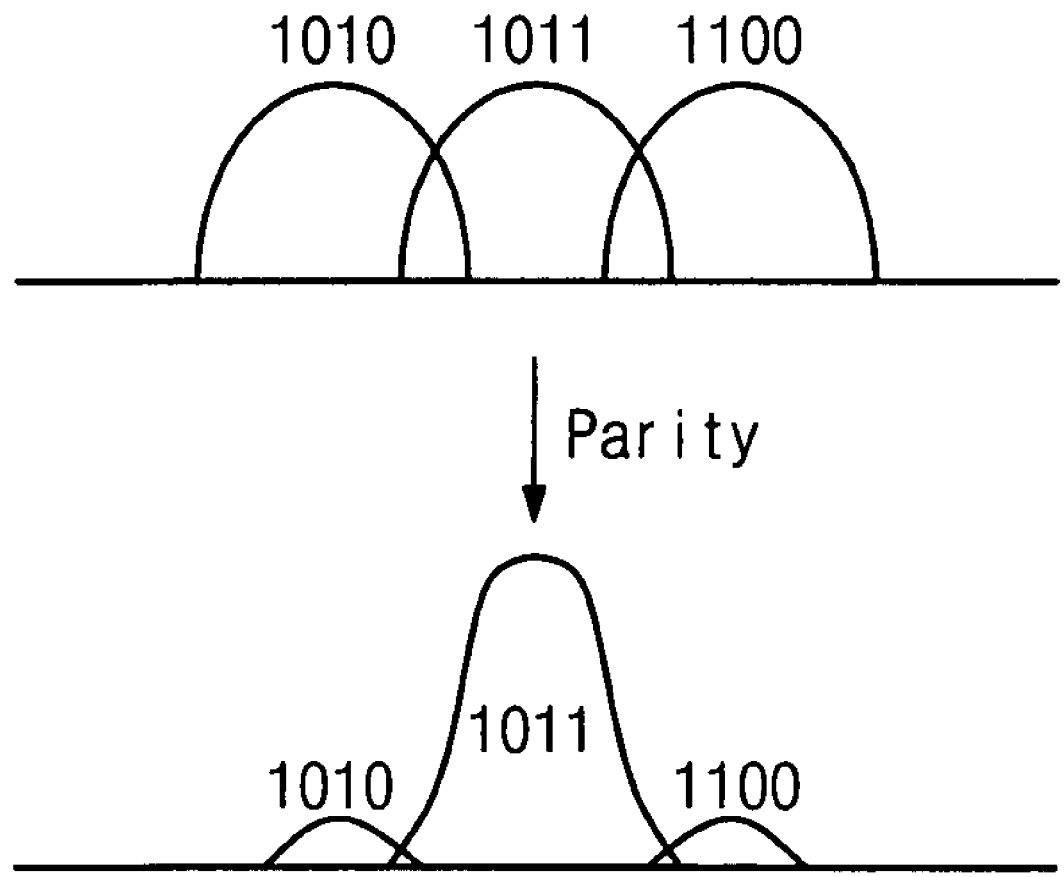
FIG. 7 is a view illustrating a data change processed by the ECC controller illustrated in FIG. 6 according to an exemplary disclosed embodiment.

In an exemplary embodiment, the first ECC block 242 that can correct tens through hundreds of bits generates a linear code as an ECC code. Some examples of the linear code include repetition codes, parity codes, cyclic codes, a Hamming code, a Golay code, Reed-Solomon codes, a Bose, Ray-Chaudhuri, Hocquenghem (BCH) code, and Reed-Muller codes. Furthermore, the ML encoder 244a of the second ECC block 244 adds parity data to the data output from the linear block encoder 242a of the first ECC block 242. When the parity data is added, the probability that original data is read accurately increases. For example, assuming that data to be read is '1011', there is a high probability that the original data of '1011' is read as data of '1010' or data of '1100'. However, when the ML encoder 244a adds parity data to the data of '1011', the probability that the original data of '1011' is read incorrectly as data '1010' or '1100' during an operation of reading the data of '1011' decreases, but the probability that the original data of '1011' is read without change during an operation of reading the data of '1011' increases. This phenomenon is illustrated in FIG. 7. It would be obvious to a person of ordinary skill in the art that the second ECC block 244 is not limited to the ML method. For example, the second ECC block 244 can be realized using other error correction methods such as, for example, fractional read manner described in U.S. Pat. No. 7,023,735. Thus, as described above, it may be possible to accurately read an original multi-bit data by reading data with a low-error probability and correcting an error of the read data.

Figure 8:
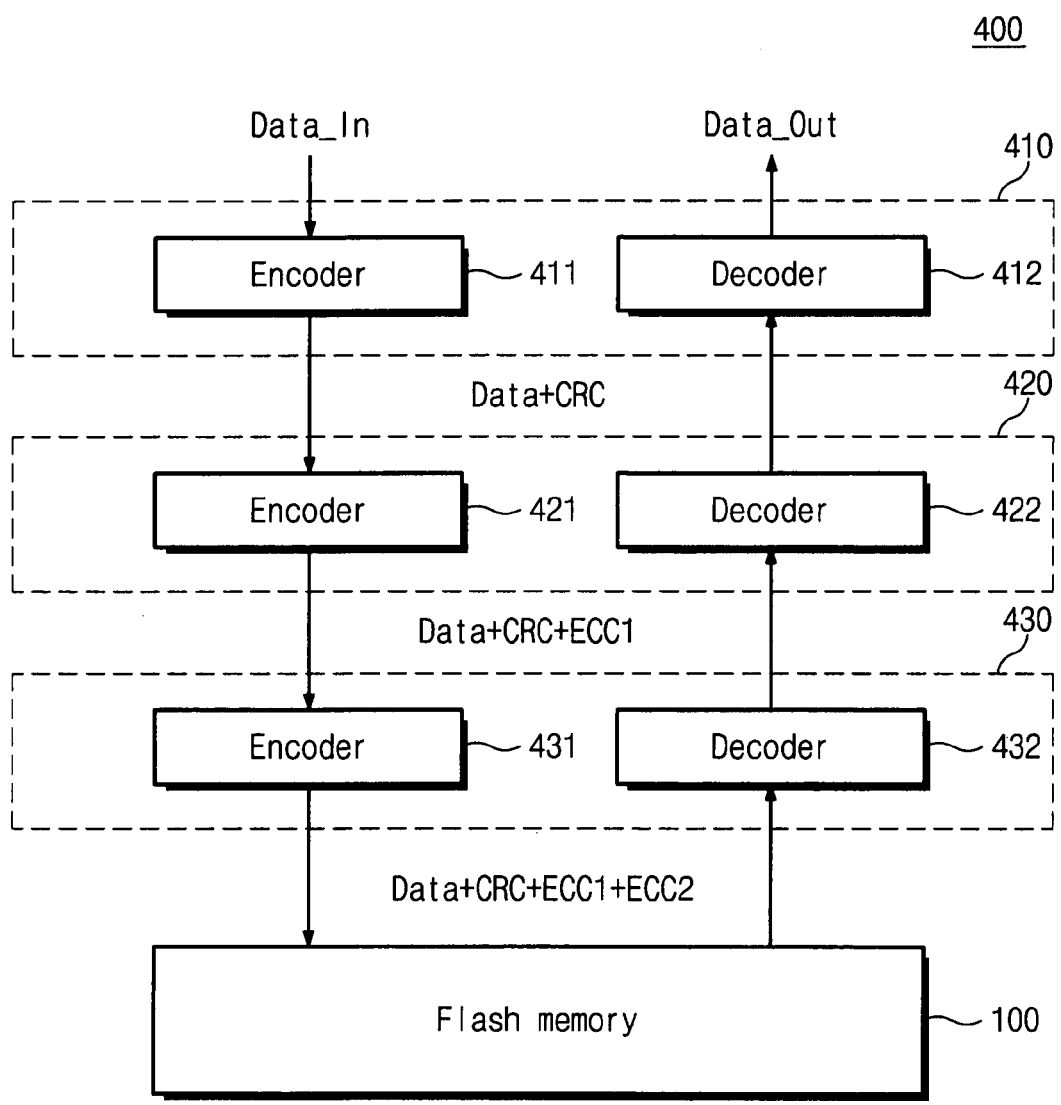
FIG. 8 is a schematic block diagram of an ECC controller according to an alternative exemplary disclosed embodiment.

It would be obvious to a person of ordinary skill in the art that the ECC controller 240 can be modified in various ways without departing from the scope of the present disclosure. For example, the ECC controller 240 can be configured to detect the existence of an error in data transmitted to the host 300 via CRC. Referring to FIG. 8, an ECC controller 400 according to another exemplary embodiment includes a first ECC block 410, a second ECC block 420, and a third ECC block 430. The first ECC block 410 includes an encoder 411 which generates a CRC value (i.e., a check sum value) from received data, and a decoder 412 for detecting the existence of an error in data output from the second ECC block 420. Because the second ECC block 420 and the third ECC block 430 correspond to blocks 242 and 244 illustrated in FIG. 6, descriptions thereof will be omitted.

In an exemplary embodiment, though not shown, the flash memory device 100 includes a memory cell array including at least two storage regions. A first storage region (a main cell region) may be used to store data transmitted from a host. A second storage region (a spare region) may be used to store ECC data (ECC1+ECC2 or CRC+ECC1+ECC2) related to the data stored in the main cell region. Furthermore, respective cells belonging to the main cell region can store multi-bit data. On the other hand, respective cells belonging to the spare cell region can store a single-bit data. Also, the main cell region can store data and ECC data in a multi-bit state.

The disclosed memory controller may be used in any system that reads and writes data to a memory device. Furthermore, by using a two-level error correcting scheme, the disclosed memory controller may read multi-bit data more accurately than other memory controllers.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An ECC (error correction code) controller of a flash memory device which stores an M-bit data (M being a positive integer equal to or greater than 2), the ECC controller comprising:
a first ECC block which generates a first ECC data from a program data to be stored in the flash memory device according to a first error correcting method; and
a second ECC block which generates a second ECC data from the first ECC data and the program data output from the first ECC block according to a second error correcting method, the program data, the first ECC data, and the second ECC data being stored in the flash memory device.

2. The controller of claim 1, wherein the second ECC block decodes data read from the flash memory using the second error correcting method and the first ECC block decodes data read from the flash memory using the first error correcting method.

3. The controller of claim 1, wherein the first error correcting method is a linear block method and the second error correcting method is an ML (maximum likelihood) method.

4. The controller of claim 1, wherein the second ECC block generates the second ECC data by adding parity data to the program data and the first ECC data.

5. The controller of claim 1, wherein the flash memory device is one of a NAND flash memory device, a NOR flash memory device, a PRAM (phase-change random access memory) device, and an MRAM device (magnetoresistive random access memory).

6. A memory system comprising:
a flash memory device which stores an M-bit data (M being a positive integer equal to or greater than 2); and
a memory controller which controls the flash memory device,
wherein the memory controller comprises an ECC controller which encodes data to be stored in the flash memory device using a first error correcting method and a second error correcting method,
wherein the first error correcting method is a linear block method and the second error correcting method is an ML (maximum likelihood) method, and
wherein the ECC controller comprises:
a first ECC block which generates a first ECC data from a program data to be stored in the flash memory device according to the linear block method; and
a second ECC block which generates a second ECC data from the first ECC data and the program data output from the first ECC block according to the maximum likelihood method, the program data, the first ECC data, and the second ECC data being stored simultaneously in the flash memory device.

7. The system of claim 6, wherein the second ECC block corrects an error of data read from the flash memory device by using the second ECC data included in the data read from the flash memory device, and the first ECC block corrects an error of the read data using the first ECC data included in read data output from the second ECC block.

8. The system of claim 6, wherein the second ECC block generates the second ECC data by adding parity data to the program data and the first ECC data.

9. The system of claim 6, wherein the flash memory device comprises a first storage region which stores the program data, and a second storage region which stores the first ECC data and the second ECC data.

10. The system of claim 9, wherein respective memory cells of the first storage region store an M-bit data, and respective memory cells of the second storage region store a 1-bit data.

11. The system of claim 6, wherein the memory controller is mounted on a main board of a computing system.

12. The system of claim 6, wherein the flash memory device and the memory controller constitute a memory card.

13. A memory system comprising:
a flash memory device which stores an M-bit data (M being a positive integer equal to or greater than 2); and
a memory controller which controls the flash memory device,
wherein the memory controller comprises:
a first ECC block which generates a CRC (cyclic redundancy check) value from a program data to be stored in the flash memory device and outputs a first data pattern; and
a second ECC block which generates a first ECC data from the first data pattern and outputs a second data pattern according to a first error correcting method; and
a third ECC block which generates a second ECC data from the second data pattern and outputs a third data pattern according to a second error correcting method.

14. The system of claim 13, wherein the first error correcting method is a linear block method and the second error correcting method is an ML (maximum likelihood) method.

15. The system of claim 13, wherein the third ECC block corrects an error of data read from the flash memory device using the second ECC data included in the data read from the flash memory device, the second ECC block corrects an error of the read data using the first ECC data included in read data output from the third ECC block, and the first ECC block detects whether the read data has an error using the CRC value included in read data output from the second ECC block.

16. The system of claim 15, wherein the third ECC block generates the second ECC data by adding parity data to the second data pattern.

17. The system of claim 15, wherein the flash memory device comprises a first storage region which stores the program data, and a second storage region which stores the CRC value, the first ECC data, and the second ECC data.

18. The system of claim 17, wherein respective memory cells of the first storage region store an M-bit data, and respective memory cells of the second storage region store a 1-bit data.

19. A method for correcting an error of an M-bit data (M being a positive integer equal to or greater than 2) stored in a flash memory device, the method comprising:

generating a first ECC data from a program data to be stored in the flash memory device according to a first error correcting method; and generating a second ECC data from the first ECC data and the program data output from a first ECC block according to a second error correcting method, the program data, the first ECC data, and the second ECC data being simultaneously stored in the flash memory device.

20. The method of claim 19, further comprising:

correcting an error of data read from the flash memory device using the second ECC data included in the data read from the flash memory device; and correcting an error of the read data using the first ECC data included in read data output from a second ECC block.

21. The method of claim 19, wherein the first error correcting method is a linear block method, and the second error correcting method is an ML (maximum likelihood) method.

22. The method of claim 19, wherein the second ECC data is generated by adding parity data to the program data and the first ECC data.

23. The method of claim 19, wherein the flash memory device is one of a NAND flash memory device, a NOR flash memory device, a PRAM, and an MRAM.

24. The method of claim 19, further including:

storing the program data in a first storage region of the flash memory device and storing the first ECC data and the second ECC data in a second storage region of the flash memory device.

25. The method of claim 24, further including storing M-bit data in respective memory cells of the first storage region and storing 1-bit data in respective memory cells of the second storage region.

26. A method for correcting an error of an M-bit data (M being a positive integer equal to or greater than 2) stored in a flash memory device, the method comprising:

generating a CRC (cyclic redundancy check) value from a program data to be stored in the flash memory device and outputting a first data pattern;

generating a first ECC data from the first data pattern and outputting a second data pattern according to a first error correcting method; and generating a second ECC data from the second data pattern and outputting a third data pattern according to a second error correcting method, the third data pattern including the program data, the CRC value, the first ECC data, and the second ECC data being stored in the flash memory device.

27. The method of claim 26, further comprising:

correcting an error in data read from the flash memory device using the second ECC data included in the data read from the flash memory device;

correcting an error of the read data using the first ECC data included in the read data output from a third ECC block; and detecting whether the read data has an error using the CRC value included in the read data output from a second ECC block.

28. The method of claim 26, wherein the second ECC data is generated by adding parity data to the second data pattern.

29. The method of claim 26, further including storing the program data in a first storage region of the flash memory device and storing the CRC value, the first ECC data, and the second ECC data in a second storage region of the flash memory device.

30. The method of claim 29, further including storing M-bit data in respective memory cells of the first storage region and storing 1-bit data in respective memory cells of the second storage region.

* * * * *